(12) United States Patent
Bertness

(10) Patent No.: US 6,871,151 B2
(45) Date of Patent: Mar. 22, 2005

(54) ELECTRONIC BATTERY TESTER WITH NETWORK COMMUNICATION

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 134 days.

(21) Appl. No.: 10/093,853

(22) Filed: Mar. 7, 2002

(65) Prior Publication Data

US 2002/0171428 A1 Nov. 21, 2002

Related U.S. Application Data

(63) Continuation-in-part of application No. 10/046,659, filed on Oct. 29, 2001, which is a continuation-in-part of application No. 09/575,627, filed on May 22, 2000, now Pat. No. 6,313,608, which is a continuation-in-part of application No. 09/564,740, filed on May 4, 2000, now Pat. No. 6,331,762, which is a continuation-in-part of application No. 08/962,754, filed on Nov. 3, 1997, now Pat. No. 6,081,098.
(60) Provisional application No. 60/132,622, filed on May 5, 1999, provisional application No. 60/165,208, filed on Nov. 12, 1999, and provisional application No. 60/175,762, filed on Jan. 12, 2000.

(51) Int. Cl.[7] .............................................. G06F 19/00
(52) U.S. Cl. ....................................... 702/63; 324/427
(58) Field of Search ........................... 702/63; 324/427, 324/426; 320/106; 701/29; 370/466

(56) References Cited

U.S. PATENT DOCUMENTS

| 2,514,745 A | 7/1950 | Dalzell ........................ 171/95 |
| 3,356,936 A | 12/1967 | Smith ........................ 324/29.5 |
| 3,562,634 A | 2/1971 | Latner ........................... 31/4 |
| 3,593,099 A | 7/1971 | Scholl ........................ 320/13 |
| 3,607,673 A | 9/1971 | Seyl ............................ 204/1 |
| 3,676,770 A | 7/1972 | Sharaf et al. .............. 324/29.5 |
| 3,729,989 A | 5/1973 | Little .......................... 73/133 |

(List continued on next page.)

FOREIGN PATENT DOCUMENTS

| DE | 29 26 716 B1 | 1/1981 |
| EP | 0 022 450 A1 | 1/1981 |

(List continued on next page.)

OTHER PUBLICATIONS

"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sep. 1959, pp. 922–925.
"Determining The End of Battery Life", by S. DeBardelaben, *IEEE*, 1986, pp. 365–368.

(List continued on next page.)

*Primary Examiner*—John Barlow
*Assistant Examiner*—Xiuqin Sun
(74) *Attorney, Agent, or Firm*—Westman, Champlin & Kelly, P.A.

(57) ABSTRACT

An electronic battery tester for testing a storage battery includes test circuitry configured to provide a battery test output related to a condition of the battery. A memory stores a battery tester address of the battery tester, and communication circuitry transmits the battery test output formatted with the battery tester address on a communication link to a remote location.

43 Claims, 2 Drawing Sheets

U.S. PATENT DOCUMENTS

| | | | |
|---|---|---|---|
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A * | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,410,754 A * | 4/1995 | Klotzbach et al. | 370/466 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |

| | | | |
|---|---|---|---|
| 5,548,273 A | 8/1996 | Nicol et al. ............... 340/439 |
| 5,550,485 A | 8/1996 | Falk ........................ 324/772 |
| 5,561,380 A | 10/1996 | Sway-Tin et al. ......... 324/509 |
| 5,562,501 A | 10/1996 | Kinoshita et al. ......... 439/852 |
| 5,572,136 A | 11/1996 | Champlin ................. 324/426 |
| 5,574,355 A | 11/1996 | McShane et al. .......... 320/39 |
| 5,583,416 A | 12/1996 | Klang ....................... 320/22 |
| 5,585,728 A * | 12/1996 | Champlin ................. 324/427 |
| 5,589,757 A | 12/1996 | Klang ....................... 320/22 |
| 5,592,093 A | 1/1997 | Klingbiel .................. 324/426 |
| 5,596,260 A | 1/1997 | Moravec et al. ........... 320/30 |
| 5,598,098 A | 1/1997 | Champlin ................. 324/430 |
| 5,602,462 A | 2/1997 | Stich et al. ............... 323/258 |
| 5,606,242 A | 2/1997 | Hull et al. ................. 320/48 |
| 5,621,298 A | 4/1997 | Harvey ..................... 320/5 |
| 5,633,985 A | 5/1997 | Severson et al. .......... 395/2.76 |
| 5,637,978 A | 6/1997 | Kellett et al. .............. 320/2 |
| 5,642,031 A | 6/1997 | Brotto ....................... 320/21 |
| 5,650,937 A | 7/1997 | Bounaga ................... 364/483 |
| 5,652,501 A | 7/1997 | McClure et al. ........... 320/17 |
| 5,653,659 A | 8/1997 | Kunibe et al. ............. 477/111 |
| 5,654,623 A * | 8/1997 | Shiga et al. ............... 320/106 |
| 5,656,920 A | 8/1997 | Cherng et al. ............. 320/31 |
| 5,675,234 A | 10/1997 | Greene ...................... 320/15 |
| 5,677,077 A | 10/1997 | Faulk ........................ 429/90 |
| 5,699,050 A | 12/1997 | Kanazawa ................. 340/636 |
| 5,701,089 A | 12/1997 | Perkins ..................... 327/772 |
| 5,705,929 A | 1/1998 | Caravello et al. .......... 324/430 |
| 5,710,503 A | 1/1998 | Sideris et al. .............. 320/6 |
| 5,711,648 A | 1/1998 | Hammerslag .............. 414/786 |
| 5,717,336 A | 2/1998 | Basell et al. ............... 324/430 |
| 5,717,937 A | 2/1998 | Fritz ......................... 395/750.01 |
| 5,739,667 A | 4/1998 | Matsuda et al. ............ 320/5 |
| 5,747,909 A | 5/1998 | Syverson et al. .......... 310/156 |
| 5,754,417 A | 5/1998 | Nicollini ................... 363/60 |
| 5,757,192 A | 5/1998 | McShane et al. .......... 324/427 |
| 5,760,587 A | 6/1998 | Harvey ..................... 324/434 |
| 5,773,978 A | 6/1998 | Becker ...................... 324/430 |
| 5,789,899 A | 8/1998 | van Phuoc et al. ......... 320/30 |
| 5,793,359 A | 8/1998 | Ushikubo .................. 345/169 |
| 5,808,469 A | 9/1998 | Kopera ..................... 324/43.4 |
| 5,818,234 A | 10/1998 | McKinnon ................. 324/433 |
| 5,821,756 A | 10/1998 | McShane et al. .......... 324/430 |
| 5,821,757 A | 10/1998 | Alvarez et al. ............. 324/434 |
| 5,825,174 A | 10/1998 | Parker ...................... 324/106 |
| 5,831,435 A * | 11/1998 | Troy ......................... 324/426 |
| 5,862,515 A | 1/1999 | Kobayashi et al. .......... 702/63 |
| 5,872,443 A | 2/1999 | Williamson ................ 320/21 |
| 5,895,440 A | 4/1999 | Proctor et al. .............. 702/63 |
| 5,914,605 A | 6/1999 | Bertness .................... 324/430 |
| 5,927,938 A | 7/1999 | Hammerslag .............. 414/809 |
| 5,929,609 A | 7/1999 | Joy et al. ................... 322/25 |
| 5,939,855 A | 8/1999 | Proctor et al. .............. 320/104 |
| 5,939,861 A | 8/1999 | Joko et al. |
| 5,945,829 A | 8/1999 | Bertness .................... 324/430 |
| 5,951,229 A | 9/1999 | Hammerslag .............. 414/398 |
| 5,961,561 A | 10/1999 | Wakefield, II ............. 701/29 |
| 5,961,604 A | 10/1999 | Anderson et al. ........... 709/209 |
| 5,969,625 A | 10/1999 | Russo ........................ 340/636 |
| 6,002,238 A | 12/1999 | Champlin .................. 320/134 |
| 6,008,652 A | 12/1999 | Theofanopoulos et al. . 324/434 |
| 6,009,369 A | 12/1999 | Boisvert et al. ............ 701/99 |
| 6,031,354 A | 2/2000 | Wiley et al. ................ 320/116 |
| 6,037,751 A | 3/2000 | Klang ........................ 320/160 |
| 6,037,777 A | 3/2000 | Champlin .................. 324/430 |
| 6,051,976 A * | 4/2000 | Bertness .................... 324/426 |
| 6,055,468 A * | 4/2000 | Kaman et al. .............. 701/29 |
| 6,061,638 A * | 5/2000 | Joyce ........................ 702/63 |
| 6,072,299 A | 6/2000 | Kurle et al. ................ 320/112 |
| 6,072,300 A | 6/2000 | Tsuji ......................... 320/116 |
| 6,081,098 A | 6/2000 | Bertness et al. ............ 320/134 |
| 6,091,245 A | 7/2000 | Bertness .................... 324/426 |
| 6,094,033 A | 7/2000 | Ding et al. ................. 320/132 |
| 6,104,167 A | 8/2000 | Bertness et al. ............ 320/132 |
| 6,114,834 A | 9/2000 | Parise ........................ 320/109 |
| 6,137,269 A | 10/2000 | Champlin .................. 320/150 |
| 6,140,797 A | 10/2000 | Dunn ........................ 320/105 |
| 6,144,185 A | 11/2000 | Dougherty et al. ......... 320/132 |
| 6,150,793 A | 11/2000 | Lesesky et al. ............. 320/104 |
| 6,161,640 A | 12/2000 | Yamaguchi ................. 180/65.8 |
| 6,163,156 A | 12/2000 | Bertness .................... 324/426 |
| 6,167,349 A | 12/2000 | Alvarez ...................... 702/63 |
| 6,172,483 B1 | 1/2001 | Champlin .................. 320/134 |
| 6,172,505 B1 | 1/2001 | Bertness .................... 324/430 |
| 6,181,545 B1 | 1/2001 | Amatucci et al. ........... 361/502 |
| 6,222,369 B1 | 4/2001 | Champlin .................. 324/430 |
| 6,225,808 B1 | 5/2001 | Varghese et al. ............ 324/426 |
| 6,236,332 B1 | 5/2001 | Conkright et al. .......... 340/825.06 |
| 6,249,124 B1 | 6/2001 | Bertness .................... 324/426 |
| 6,250,973 B1 | 6/2001 | Lowery et al. ............. 439/763 |
| 6,254,438 B1 | 7/2001 | Gaunt ....................... 439/755 |
| 6,259,254 B1 | 7/2001 | Klang ....................... 324/427 |
| 6,262,563 B1 | 7/2001 | Champlin .................. 320/134 |
| 6,263,268 B1 | 7/2001 | Nathanson ................. 701/29 |
| 6,294,896 B1 | 9/2001 | Champlin .................. 320/134 |
| 6,294,897 B1 | 9/2001 | Champlin .................. 320/153 |
| 6,304,087 B1 | 10/2001 | Bertness .................... 324/426 |
| 6,307,349 B1 | 10/2001 | Koenck et al. ............. 320/112 |
| 6,310,481 B2 | 10/2001 | Bertness .................... 324/430 |
| 6,313,607 B1 | 11/2001 | Champlin .................. 320/132 |
| 6,313,608 B1 | 11/2001 | Varghese et al. ............ 32/132 |
| 6,316,914 B1 | 11/2001 | Bertness .................... 320/134 |
| 6,323,650 B1 | 11/2001 | Bertness et al. ............ 324/426 |
| 6,329,793 B1 | 12/2001 | Bertness et al. ............ 320/132 |
| 6,331,762 B1 | 12/2001 | Bertness .................... 320/134 |
| 6,332,113 B1 | 12/2001 | Bertness .................... 702/63 |
| 6,346,795 B2 | 2/2002 | Haraguchi et al. .......... 320/136 |
| 6,347,958 B1 | 2/2002 | Tsai .......................... 439/488 |
| 6,351,102 B1 | 2/2002 | Troy ......................... 320/139 |
| 6,359,441 B1 | 3/2002 | Bertness .................... 324/426 |
| 6,363,303 B1 | 3/2002 | Bertness .................... 701/29 |
| 6,384,608 B1 | 5/2002 | Namaky ..................... 324/425 |
| 6,388,448 B1 | 5/2002 | Cervas ...................... 324/426 |
| 6,392,414 B2 | 5/2002 | Bertness .................... 324/429 |
| 6,411,098 B1 | 6/2002 | Laletin ....................... 324/436 |
| 6,417,669 B1 | 7/2002 | Champlin .................. 324/426 |
| 6,424,158 B2 | 7/2002 | Klang ........................ 324/433 |
| 6,441,585 B1 | 8/2002 | Bertness .................... 320/132 |
| 6,445,158 B1 | 9/2002 | Bertness et al. ............ 320/104 |
| 6,466,025 B1 | 10/2002 | Klang ........................ 324/429 |
| 6,466,026 B1 | 10/2002 | Champlin .................. 324/430 |
| 2002/0171428 A1 | 11/2002 | Bertness .................... 324/426 |

FOREIGN PATENT DOCUMENTS

| | | |
|---|---|---|
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |

| | | |
|---|---|---|
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |

OTHER PUBLICATIONS

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–4$^{th}$–Order–Elliptic Notch Filter", 12/94, RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://powederdesigners.com/InforWeb.design_center/articles/DC–DC/converter.shtm, undated.

"Notification of Transmittal of The International Search Report or the Declaration", PCT/US03/06577.

* cited by examiner

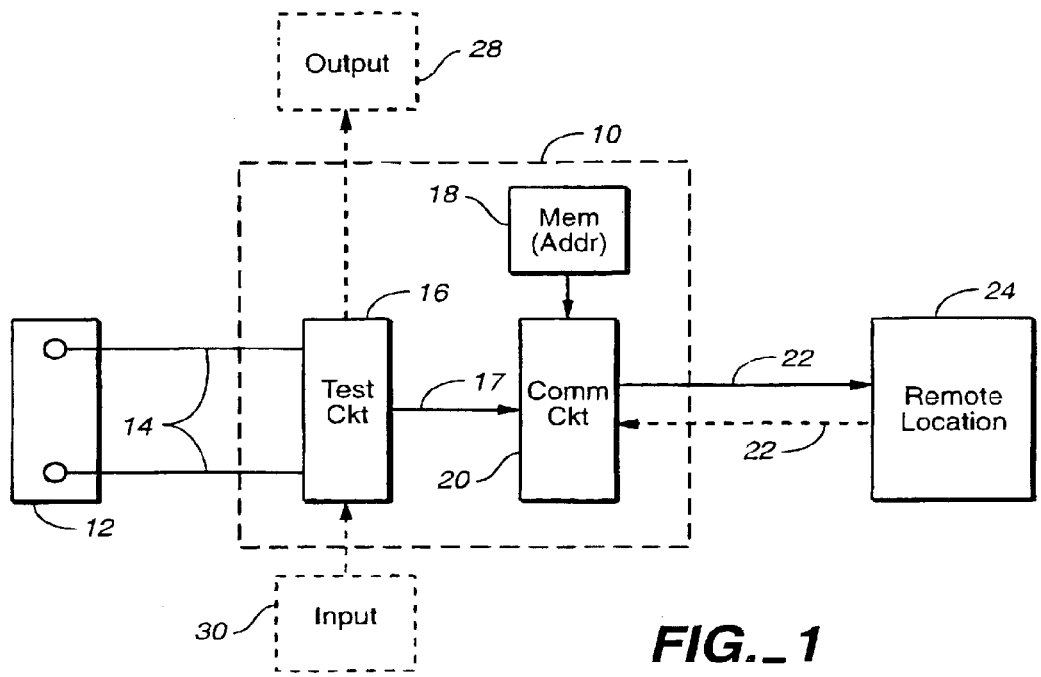
FIG._1
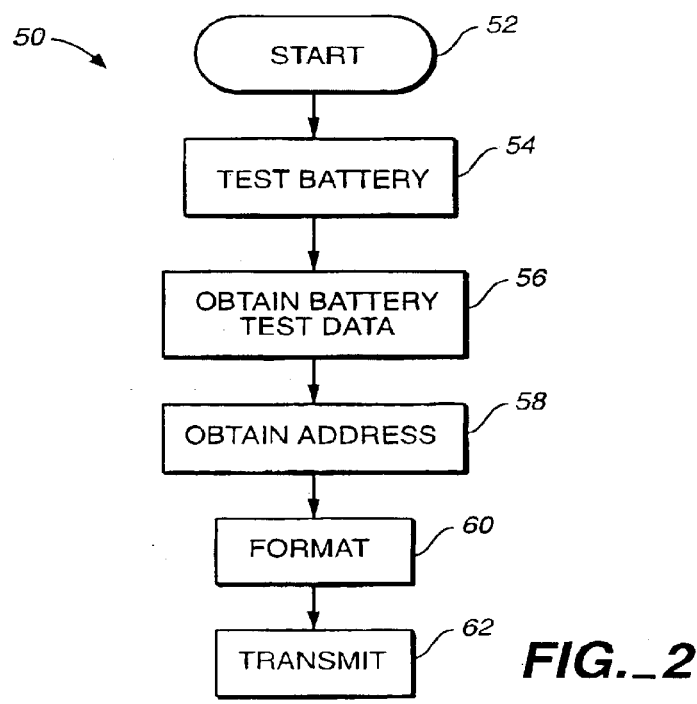
FIG._2

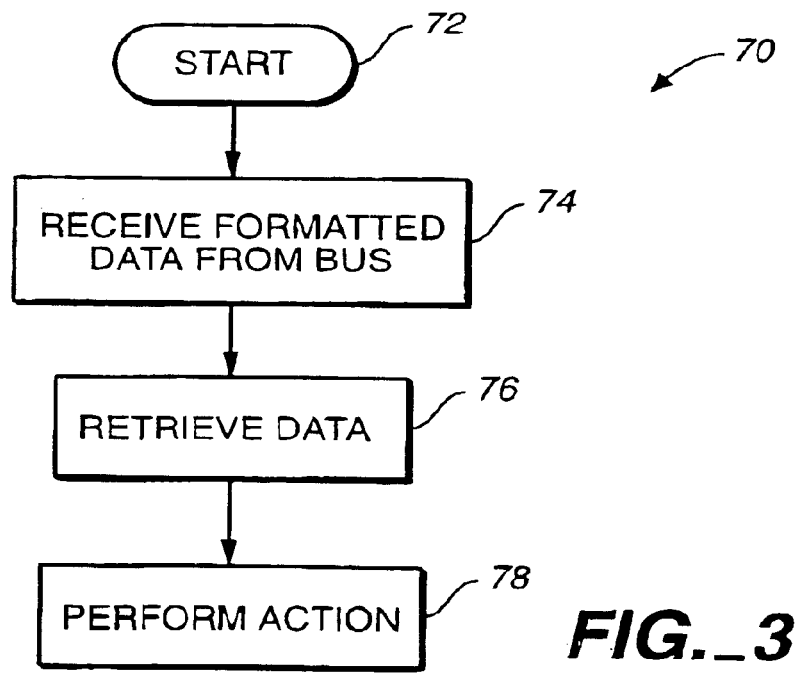
FIG._3
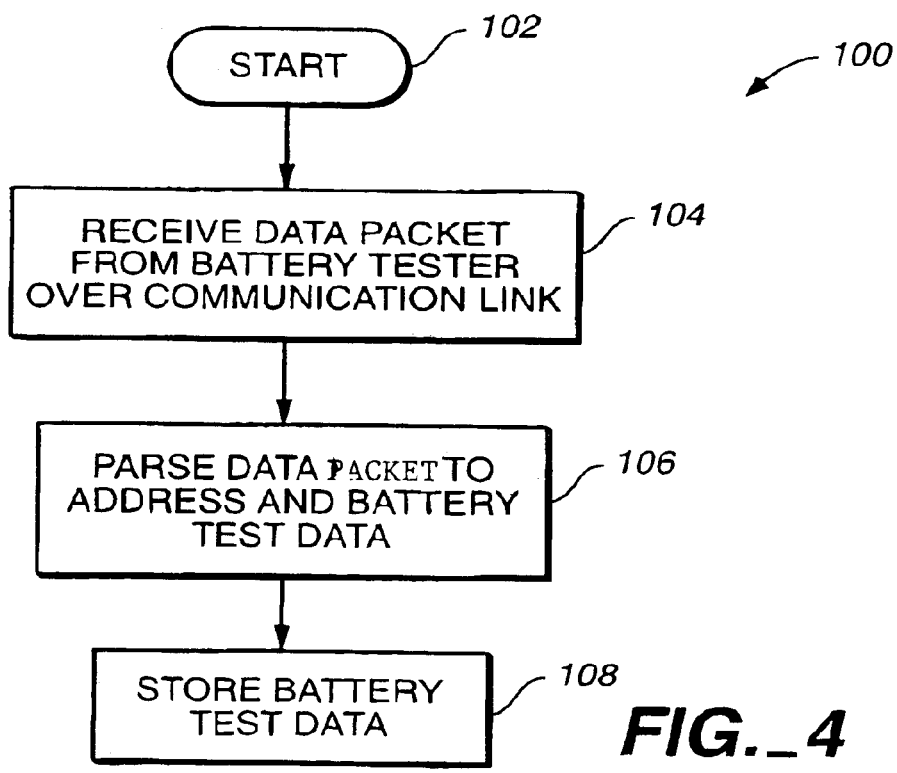
FIG._4

ELECTRONIC BATTERY TESTER WITH NETWORK COMMUNICATION

The present application is a Continuation-In-Part of and claims priority of U.S. Ser. No. 10/046,659, filed Oct. 29, 2001, which is a Continuation-In-Part of Ser. No. 09/564, 740, filed May 4, 2000, now U.S. Pat. No. 6,331,762, which is a Continuation-In-Part of application Ser. No. 08/962,754, filed Nov. 3, 1997, now U.S. Pat. No. 6,081,098 and also a Continuation-In-Part of application Ser. No. 09/575,627, filed May 22, 2000, now U.S. Pat No. 6,313,608, which is a Continuation-In-Part of application Ser. No. 08/962,754, filed Nov. 3, 1997, now U.S. Pat. No. 6,081,098 and also claims priority to Provisional Application Ser. No. 60/132, 622, filed May 5, 1999, U.S. Provisional Application No. 60/165,208, filed Nov. 12, 1999, and Provisional Application Ser. No. 60/175,762, filed Jan. 12, 2000, and entitled ENERGY MANAGEMENT SYSTEM FOR AUTOMOTIVE VEHICLE, the contents of which are hereby incorporated by reference in their entirety.

BACKGROUND OF THE INVENTION

The present invention relates to electronic battery testers of the type used to perform tests on storage batteries.

Electronic battery testers are used to test and determine the condition of storage batteries. Examples of electronic battery testers and related technologies are shown in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572, 136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585, 728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592, 093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Serial No. 09/293,020, filed Apr. 16, 1999, entitled AUTOMOTIVE BATTERY CHARGING SYSTEM TESTER; U.S. Serial No. 09/560,920, filed Apr. 28, 2000, entitled MULTI-LEVEL CONDUCTANCE TESTER; U.S. Serial No. 09/431,446, filed Nov. 1, 1999, entitled ALTERNATOR DIAGNOSTIC SYSTEM; U.S. Serial No. 09/595,102, filed Jun. 15, 2000, entitled APPARATUS AND METHOD FOR TESTING RECHARGEABLE ENERGY STORAGE BATTERIES; U.S. Serial No. 09/703,270, filed Oct. 31, 2000, entitled ELECTRONIC BATTERY TESTER; U.S. Serial No. 09/575,629, filed May 22, 2000, entitled VEHICLE ELECTRICAL SYSTEM TESTER WITH ENCODED OUTPUT; U.S. Serial No. 09/780,146, filed Feb. 9, 2001, entitled STORAGE BATTERY WITH INTEGRAL BATTERY TESTER; U.S. Serial No. 09/816,768, filed Mar. 23, 2001, entitled MODULAR BATTERY TESTER; U.S. Serial No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Serial No. 09/862,783, filed May 21, 2001, entitled METHOD AND APPARATS FOR TESTING CELLS AND BATTERIES EMBEDDED IN SERIES/PARALLEL SYSTEMS; U.S. Serial No. 09/483,623, filed Jan. 13, 2000, entitled ALTERNATOR TESTER; U.S. Serial No. 09/870,410, filed May 30, 2001, entitled INTEGRATED CONDUCTANCE AND LOAD TEST BASED ELECTRONIC BATTERY TESTER; U.S. Serial No. 09/960,117, filed Sep. 20, 2001, entitled IN-VEHICLE BATTERY MONITOR; U.S. Serial No. 09/908,389, filed Jul. 18, 2001, entitled BATTERY CLAMP WITH INTEGRATED CIRCUIT SENSOR; U.S. Serial No. 09/908,278, filed Jul. 18, 2001, entitled BATTERY CLAMP WITH EMBEDDED ENVIRONMENT SENSOR; U.S. Serial No. 09/880,473, filed Jun. 13, 2001; entitled BATTERY TEST MODULE; U.S. Serial No. 09/876,564, filed Jun. 7, 2001, entitled ELECTRONIC BATTERY TESTER; U.S. Serial No. 09/878,625, filed Jun. 11, 2001, entitled SUPPRESSING INTERFERENCE IN AC MEASUREMENTS OF CELLS, BATTERIES AND OTHER ELECTRICAL ELEMENTS; U.S. Serial No. 09/902,492, filed Jul. 10, 2001, entitled APPARATUS AND METHOD FOR CARRYING OUT DIAGNOSTIC TESTS ON BATTERIES AND FOR RAPIDLY CHARGING BATTERIES; and U.S. Serial No. 09/940,684, filed Aug. 27, 2001, entitled METHOD AND APPARATUS FOR EVALUATING STORED CHARGE IN AN ELECTROCHEMICAL CELL OR BATTERY; U.S. Serial No. 09/977,049, filed Oct. 12, 2001, entitled PROGRAMMABLE CURRENT EXCITER FOR MEASURING AC IMMITTANCE OF CELLS AND BATTERIES; U.S. Serial No. 10/047,923, filed Oct. 23, 2001, entitled AUTOMOTIVE BATTERY CHARGING SYSTEM TESTER, U.S. Serial No. 10/046,659, filed Oct. 29, 2001, entitled ENERGY MANAGEMENT SYSTEM FOR AUTOMOTIVE VEHICLE; U.S. Serial No. 09/993,468, filed Nov. 14, 2001, entitled KELVIN CONNECTOR FOR A BATTERY POST; U.S. Serial No. 09/992,350, filed Nov. 26, 2001, entitled ELECTRONIC BATTERY TESTER, U.S. Serial No. 10/042,451, filed Jan. 8, 2002, entitled BATTERY CHARGE CONTROL DEVICE; and U.S. Serial No. 10/073,378, filed Feb. 8, 2002, entitled METHOD AND APPARATUS USING A CIRCUIT MODEL TO EVALUATE CELL/BATTERY PARAMETERS, which are incorporated herein in their entirety.

As storage batteries have found increasing use in various industries, the use of electronic battery testers to test those batteries has expanded. Example uses include batteries for vehicles (with or without internal combustion engines) and batteries for back up power supplies such as those used in telecommunication installations.

To address this increased use, various diagnostic and testing techniques and systems for use with storage batteries have advanced in recent times. However, a typical electronic battery tester simply provides an output which is viewed by a user or technician. The data is used to make a determination regarding the condition and possible need for replacement of a storage battery. Once that determination is made, the output from the battery tester is typically discarded when the battery tester is disconnected.

The increasing use of electronic battery testers has resulted in an increasing number of battery tests which are performed and consequently resulted in an increased amount of data related to storage batteries. However, advantages from this increased amount of data has been largely unrecognized.

SUMMARY OF THE INVENTION

An electronic battery tester for testing a storage battery includes test circuitry configured to couple to the storage battery and provide a battery test output related to a condition of the battery. A memory is configured to store a battery tester address of the battery tester. Communication circuitry transmits the battery test output formatted with the battery tester address on a communication link to a remote location.

BRIEF DESCRIPTION OF THE DRAWINGS

FIG. 1 is a simplified block diagram of a battery tester in accordance with one example embodiment of the present invention.

FIG. 2 is a simplified flow chart showing steps in accordance with one example embodiment of the invention.

FIG. 3 is a simplified block diagram showing steps associated with retrieving data in accordance with one example embodiment of the invention.

FIG. 4 is a simplified block diagram showing steps in accordance with receiving battery test data.

DETAILED DESCRIPTION OF THE PREFERRED EMBODIMENTS

The present invention includes the recognition that the output from electronic battery testers can provide useful diagnostic or other information for analysis to a remote location. In one aspect, the present invention includes providing an electronic battery tester with a battery tester address and transmitting the result of a battery test, data recovered the test during or from the battery, or related to the battery test, to a remote location in a manner in which the battery tester address is formatted (i.e., in some way combined or associated with) with the battery test data. This information is transmitted to a remote location for subsequent review or processing. Similarly, the battery tester can receive information when the information is associated with the battery tester address.

FIG. 1 is a simplified block diagram showing an electronic battery tester 10 in accordance with one example embodiment of the present invention. Electronic battery tester 10 couples to storage battery 12 through electrical connections 14. In one embodiment, connections 14 are Kelvin connections. However, the invention is not limited to such a configuration. The connection can be any type of connection including non-physical connections and can comprise any number of connections. Electronic battery tester 10 includes test circuitry 16 which is configured to perform a test on battery 12 using any type of known or yet to be discovered battery test and provide a battery test result (or output) 17.

A memory 18 contains a battery tester address associated with the battery tester 10. In some embodiments, the address is not unique. Communication circuitry 20 couples to the test circuitry 16 and the memory 18 and is configured to format information related to the battery test (battery test data) along with the battery tester address on a communication link 22. Line 22 can, for example, couple to a remote location 24. The communication link 22 can operate bi-directionally or in a single direction, carrying data between tester 10 and remote location 24. The link 22 can be a network, such as a computer network. Example network implementations include ethernet, token ring, PPP (point to point protocol), SLIP, or other protocols including proprietary protocols.

FIG. 1 also illustrates an optional output 28 which can be used to provide an output related to the battery test. Similarly, an optional input 30 can be used to input data. For example, the data can relate to the type of battery 12 or be used in the determination of a relative condition of battery 12, for example by receiving a battery rating. The output 28 and the input 30 can be for use by an operator, such as a display and a manual input, or it can be coupled to other equipment. The input 30 and output 28 can be over physical or non-physical connections. The various components of battery tester 10 including output 28 and input 30, can be implemented using any number of components and FIG. 1 is provided to illustrate a simplified block diagram. With microprocessor based circuitry, the various blocks illustrated in FIG. 1 may be implemented in shared components and their physical implementation may not break down into the discrete blocks illustrated in the Figure. The various components can be implemented in hardware, software or their combination.

FIG. 2 is a simplified block diagram 50 showing example steps in accordance with the present invention. The various steps shown in FIG. 2 may be implemented in any order, or wholly or partially in parallel, and are not limited to the particular implementation shown in the Figure. At block 52, the process starts and control is passed to block 54 where the storage battery 12 is tested. At optional block 56, battery test data is obtained. This can be any data which is related to the battery test and may or may not include the battery test result obtained at block 54. At block 58, the address of the battery tester 10 is obtained from memory 18. At block 60, tester 10 formats the battery test data with the battery tester address. The formatted data is transmitted over communication link 22 at block 62.

The battery test performed at block 54 by test circuitry 16 can be any known or yet to be discovered battery test. In one aspect, the battery test is based upon a dynamic measurement, that is a measurement in which a time varying signal is used in performing the battery test. In another example aspect, electrical connections 14 comprise Kelvin connections.

The battery test output 17 can be any type of output from a battery test including a qualitative or a quantitative output. The optional battery test related data can be any type of data related to the battery test including various measurements used in obtaining the battery test output (such as voltages, currents, information related to timing, time periods, signals and waveforms, etc.) or other types of data including temperature (either ambient or some other temperature such as the temperature of battery 12), battery serial number, model number, vehicle identification or serial number, geographic related information, time and/or date information, data which identifies the operator, the steps performed by the operator or the battery test, the vehicle VIN number, data obtained from the vehicle computer or computer system, data related to the architecture of a backup or auxiliary battery site including the equipment, number of battery strings and types of batteries, maintenance related data, etc. The data can be obtained from existing or yet to be implemented vehicle communication bus structures including the CAN bus, J1939, J1850, etc. Other types of data includes bar code information, dealer information, codes such as warranty codes, count information related to how many times or when a particular battery tester was used, information relating to promotions or sales, etc. Additionally, data can be a compilation of data collected over a period of time, either raw data or data which has been analyzed or otherwise used by the battery tester.

FIG. 3 is a simplified block diagram 70 showing steps associated with the receiving of data by electronic battery tester 10 over communication link 22. The procedure starts at 72 and at block 74 the formatted data is received from bus 22. This formatted data is of a similar format to that discussed in connection with FIG. 2 and contains information along with the address of the electronic battery tester 10. The formatted data is extracted and retrieved at step 76 and some type of action is performed at step 78. The particular type of action can be any type of action including actions in which the retrieved data is acted upon as a function of the retrieved data, stored in memory 18 for future use, immediately displayed or otherwise utilized by battery tester 10, etc.

Communication link 22 is any type of physical or non-physical communication link, or a combination. Examples include electrical wiring, infrared, Radio Frequency (RF), etc. The data carried on communication link 22 can be unidirectional or bi-directional and can be in accordance with any communication protocol. The data carried on communication link can be in an encrypted format in accordance with any encryption technique. In various aspects, the address of battery tester 10 can be a shared address, a locally unique address or a globally unique address.

One example protocol for data on link 22 is the TCP/IP protocol. In such an embodiment, the address of battery tester 10 can be an IP (Internet Protocol) address. For example, RFC791 promulgated by the Internet Engineering Taskforce in September 1981 defines such an address. In one specific example, the address consists of at least four groups of data, each group comprises at least 8 bits.

Data can be sent in response to an event at battery tester 10, at particular times, or in response to polling from remote location 24. If a two-way communication link 22 is used, data and/or programming instructions in tester 10 can be updated as desired and tester 10 can be controlled from a remote location.

Remote location 24 can collect data from one or more battery testers. The data can be placed into a database format for subsequent analysis. For example, statistics of the data can be calculated and used in order to diagnose or research battery failures, sales trends, usage, or other aspects related to battery tests, installation, use and ultimate failure. Additionally, data can be correlated with vehicles, geographical areas, dealers, etc., including how battery testers are being used.

When retrieving data, various types of information can be retrieved by electronic battery tester 10. For example, battery test parameters or test criteria can be automatically updated as can tables or battery ratings. The battery tester software can be updated as desired as new releases become available. Service bulletins related to a particular test, or particular type of battery, particular vehicle or problem associate with a battery or battery test can be provided to the operated or stored in the memory for future use. The test procedures for unusual cars, or tests which are difficult to perform, can be looked up on a remove database. An authorization can be received in which the operator receives an authorization to replace a battery, for example a battery which is under warranty. The authorizations can be a function of data contained at a remote location, for example if a particular location has an unusually high rate of warranty returns, a request for authorization to return a battery could be denied, or otherwise identified for subsequent auditing. The battery tester 10 can also take advantage of increased computing power which might be available at a remove location. Data available over the internet can be retrieved for use during the test. For example, weather information or statistics can be obtained for a particular area such that the battery test is modified as function of the current or predicted weather. If a cold period is imminent, for example, a harsher test can be employed. If a battery is replaced, an inventor list can be updated such that a inventory is reordered, for example, by sending an email or other communication to a distributor. If the battery itself has a unique identification, for example a serial number, this information can be used to monitor the battery from "cradle to grave". For example, various tests performed throughout the life of the battery can be utilized to observe trends in the battery test. Further, service alerts or other information can be linked to a battery.

FIG. 4 is a simplified block diagram 100 showing steps performed in accordance with receiving data from an electronic battery tester in accordance with the present invention. The receiving can be, for example, at a remote manufacturing or management site. At block 102 the procedure starts and control is passed to block 104 where a data pack is received from the electronic battery tester over the communication link. At block 106, the data packet is parsed into the address which identifies the electronic battery tester and the battery test data contained within the data packet. At block 108, the battery test data is stored or otherwise operated upon. Various examples of such operations are discussed above.

Although the present invention has been described with reference to preferred embodiments, workers skilled in the art will recognize that changes may be made in form and detail without departing from the spirit and scope of the invention.

What is claimed is:

1. A method for receiving battery test data from an electronic battery tester configured to test a storage battery, comprising:

receiving a data packet over a communication link;
parsing the data packet into an address which identifies the electronic battery tester and into battery test data provided by the electronic battery tester; and storing the battery test data.

2. The method of claim 1 wherein the communication link comprises a physical connection.

3. The method of claim 1 wherein the communication link comprises a non-physical connection.

4. The method of claim 1 wherein the communication link is in accordance with TCP/IP.

5. The method of claim 1 wherein the address comprises an IP address.

6. The method of claim 5 wherein the IP address comprises four groups of eight bits each.

7. The method of claim 1 wherein the address comprises a unique address.

8. The method of claim 1 wherein the communication link is bi-directional.

9. The method of claim 1 including coupling battery test circuitry to a battery through a Kelvin connection.

10. The method of claim 9 including measuring dynamic parameter of the battery with the test circuitry.

11. The method of claim 1 including receiving a user input.

12. The method of claim 11 wherein the battery test data includes data received through the user input.

13. The method of claim 12 wherein the data received through the user input comprises a battery rating.

14. The method of claim 12 wherein the data received through the user input comprises a battery type.

15. The method of claim 1 including displaying an output related to the condition of the battery.

16. The method of claim 15 wherein the battery test data includes the output related to the condition of the battery.

17. The method of claim 1 wherein the battery test data includes data used by the test circuitry to determine the condition of the battery.

18. The method of claim 1 wherein the battery test data includes data received through a bar code.

19. The method of claim 1 wherein the battery test data includes data which identifies a dealer.

20. The method of claim 1 wherein the battery test data includes a warranty code.

21. The method of claim 1 wherein the battery test data includes count information.

22. The method of claim 1 wherein the battery test includes information related to a promotion.

23. The method of claim 1 wherein the battery test data includes a compilation of data.

24. The method of claim 1 wherein the battery test data is encrypted.

25. The method of claim 1 wherein the battery test data is transmitted on the communication link at predetermined times.

26. The method of claim 1 wherein the battery test data is transmitted on the communication link in response to polling of the battery tester.

27. The method of claim 1 wherein the battery test data includes a vehicle identification number (VIN).

28. The method of claim 1 wherein the battery test data includes data retrieved from a data bus of the vehicle.

29. The method of claim 1 wherein the battery tester retrieves test parameter updates.

30. The method of claim 1 wherein the battery tester receives software updates.

31. The method of claim 1 wherein the battery tester receives service bulletins.

32. The method of claim 1 wherein the battery tester receives test procedures.

33. The method of claim 1 wherein the battery tester receives battery replacement authorization.

34. The method of claim 1 wherein the battery tester receives weather related information.

35. The method of claim 1 wherein the battery tester receives information related to the specific battery under test.

36. An electronic battery tester for testing a storage battery, comprising:
   test circuitry configured to couple to the storage battery and provide a battery test output related to a condition of the battery;
   a memory configured to store a battery tester address of the battery tester;
   communication circuitry configured to transmit battery test data formatted with the battery tester address on a communication link to a remote location; and
   wherein the battery test data includes count information.

37. An electronic battery tester for testing a storage battery, comprising:
   test circuitry configured to couple to the storage battery and provide a battery test output related to a condition of the battery;
   a memory configured to store a battery tester address of the battery tester;
   communication circuitry configured to transmit battery test data formatted with the battery tester address on a communication link to a remote location; and
   wherein the battery test data includes information related to a promotion.

38. An electronic battery tester for testing a storage battery, comprising:
   test circuitry configured to couple to the storage battery and provide a battery test output related to a condition of the battery;
   a memory configured to store a battery tester address of the battery tester;
   communication circuitry configured to transmit battery test data formatted with the battery tester address on a communication link to a remote location;
   wherein the communication link is bi-directional; and tester receives test procedures.

39. An electronic battery tester for testing a storage battery, comprising:
   test circuitry configured to couple to the storage battery and provide a battery test output related to a condition of the battery;
   a memory configured to store a battery tester address of the battery tester;
   communication circuitry configured to transmit battery test data formatted with the battery tester address on a communication link to a remote location;
   wherein the communication link is bi-directional; and wherein the battery tester receives battery replacement authorization.

40. A method for testing a storage battery with a battery tester, comprising:
   coupling to the storage battery and providing a battery test output related to a condition of the battery;
   retrieving a battery tester address of the battery tester from a memory;
   transmitting battery test data formatted with the battery tester address on a communication link to a remote location; and
   wherein the battery test data includes count information.

41. A method for testing a storage battery with a battery tester, comprising:
   coupling to the storage battery and providing a battery test output related to a condition of the battery;
   retrieving a battery tester address of the battery tester from a memory;
   transmitting battery test data formatted with the battery tester address on a communication link to a remote location; and
   wherein the battery test data includes information related to a promotion.

42. A method for testing a storage battery with a battery tester, comprising:
   coupling to the storage battery and providing a battery test output related to a condition of the battery;
   retrieving a battery tester address of the battery tester from a memory;
   transmitting battery test data formatted with the battery tester address on a communication link to a remote location; and
   receiving test procedures on the link.

43. A method for testing a storage battery with a battery tester, comprising:
   coupling to the storage battery and providing a battery test output related to a condition of the battery;
   retrieving a battery tester address of the battery tester from a memory;
   transmitting battery test data formatted with the battery tester address on a communication link to a remote location; and
   receiving battery replacement authorization on the link.

* * * * *